(12) United States Patent
Noh (10) Patent No.: US 8,093,089 B2
(45) Date of Patent: Jan. 10, 2012

(54) METHODS OF MANUFACTURING IMAGE SENSORS INCLUDING GETTERING REGIONS

(75) Inventor: Hyun-Pil Noh, Seongnam-si (KR)

(73) Assignee: Samsung Electronics Co., Ltd., Gyeonngi-do (KR)

( * ) Notice: Subject to any disclaimer, the term of this patent is extended or adjusted under 35 U.S.C. 154(b) by 0 days.

(21) Appl. No.: 12/662,453

(22) Filed: Apr. 19, 2010

(65) Prior Publication Data

US 2010/0267184 A1    Oct. 21, 2010

(30) Foreign Application Priority Data

Apr. 21, 2009    (KR) .................. 10-2009-0034767

(51) Int. Cl.
| H01L 21/00 | (2006.01) |
| H01L 21/8232 | (2006.01) |
| H01L 21/335 | (2006.01) |
| H01L 21/8222 | (2006.01) |
| H01L 21/331 | (2006.01) |
| H01L 21/76 | (2006.01) |

(52) U.S. Cl. .......... 438/58; 438/143; 438/310; 438/402; 438/471; 438/473; 257/E21.277; 257/E21.318; 257/E21.32; 257/E21.321; 257/E21.342

(58) Field of Classification Search ........... 257/E21.318, 257/E21.32, E21.321, E21.342
See application file for complete search history.

(56) References Cited

U.S. PATENT DOCUMENTS

| 7,470,944 B2 * | 12/2008 | Ishida et al. ................ 257/292 |
| 2005/0046331 A1 * | 3/2005 | Kim et al. ..................... 313/493 |
| 2005/0104100 A1 | 5/2005 | Ishida |
| 2006/0175613 A1 * | 8/2006 | Lee et al. ....................... 257/65 |
| 2011/0053305 A1 * | 3/2011 | Kanbe ............................ 438/58 |

FOREIGN PATENT DOCUMENTS

| JP | 06-338507 | 12/1994 |
| JP | 06-342798 | 12/1994 |
| JP | 2004-031677 | 1/2004 |
| JP | 2004-335674 | 11/2004 |

* cited by examiner

*Primary Examiner* — Mohsen Ahmadi
(74) *Attorney, Agent, or Firm* — Harness, Dickey & Pierce, PLC (57) ABSTRACT

Method of manufacturing image sensors having a plurality of gettering regions. In the method, a gate electrode may be formed on a semiconductor substrate. A source/drain region may be formed in the semiconductor substrate to be overlapped with the gate electrode. A gettering region may be formed in the semiconductor substrate to be adjacent to the source/drain region.

10 Claims, 6 Drawing Sheets

METHODS OF MANUFACTURING IMAGE SENSORS INCLUDING GETTERING REGIONS

CROSS-REFERENCE TO RELATED APPLICATION

This application claims priority under 35 U.S.C. §119 to Korean Patent Application No. 10-2009-0034767, filed on Apr. 21, 2009, in the Korean Intellectual Property Office (KIPO), the entire contents of which is incorporated herein by reference.

BACKGROUND

1. Field

Example embodiments of the inventive concepts relate to methods of manufacturing complementary metal oxide semiconductor (CMOS) image sensors including gettering regions.

2. Description of Related Art

A complementary metal oxide semiconductor (CMOS) image sensor is a semiconductor device that may convert incident light into an electric signal. CMOS image sensors may include a photodiode and metal oxide semiconductor transistors in a pixel. Electrical characteristics of the photodiode and the metal oxide semiconductor transistors may correspond to driving characteristics of the CMOS image sensor.

Semiconductor substrates of CMOS image sensors may receive contaminants, such as metal atoms, during formation of metal oxide semiconductor transistors. The contaminants may be implanted into the semiconductor substrate incidental to an ion implantation process performed on the semiconductor substrate to form source and drain regions of the metal oxide semiconductor transistors. The metal atoms may diffuse into the photodiode and degrade optical characteristics of the CMOS sensor.

SUMMARY

Example embodiments of the inventive concepts may provide methods of manufacturing image sensors in which deterioration of optical characteristics of the image sensor caused by contamination of metal atoms may be prevented and/or reduced.

A method of manufacturing an image sensor according to example embodiments of the inventive concepts may include forming a gate electrode on a semiconductor substrate. A source/drain region may be formed in the semiconductor substrate. The source/drain region may be disposed below one side of the gate electrode. A gettering region may be formed in the semiconductor substrate. The gettering region may be adjacent to the source/drain region. The gettering region may be spaced apart from the source/drain region by a distance of about 1 Å to 3,000 Å.

A method of manufacturing an image sensor according to example embodiments of the inventive concepts may include forming a gate electrode on a semiconductor substrate, forming a source/drain region in the semiconductor substrate adjacent to the gate electrode and forming a gettering region in the semiconductor substrate a distance of about 1 Å to about 3,000 Å from the source/drain region.

A photodiode may be formed in the semiconductor substrate. The photodiode may be under the other side of the gate electrode. The gettering region may be formed from an upper surface of the semiconductor substrate at a depth shallower than a lower surface of the photodiode. The gettering region may be formed from an upper surface of the semiconductor substrate to a depth of about 500 Å to about 3,000 Å. The gettering region may be formed at a lower region of the source/drain region, or formed to surround lower and lateral regions of the source/drain region.

The source/drain region and the gettering region may be formed using the same mask pattern by implanting different impurity ions from each other. The gettering region may be formed by implanting carbon atoms through an ion implantation process. The carbon atoms may be implanted into the semiconductor substrate at a dose of about $1.0E14$ atoms/cm$^2$ to about $5.0E15$ atoms/cm$^2$, and with an energy of about 10 keV to about 100 keV. The carbon atoms may be implanted into the semiconductor substrate along a direction perpendicular or inclined to the semiconductor substrate.

A method of manufacturing an image sensor according to example embodiments of the inventive concepts may include forming a plurality of gate electrodes on a semiconductor substrate. The gate electrodes may include a transfer gate electrode, a reset gate electrode, a drive gate electrode, and a selection gate electrode. A photodiode may have n-type and p-type impurity ions in a region of the semiconductor substrate. The photodiode may be formed under one side of the transfer gate electrode. Source/drain regions may have n-type impurity ions in other region of the semiconductor substrate. The source/drain regions may be formed around the other side of the transfer gate electrode, and the reset, drive and selection gate electrodes. Carbon atoms may be implanted into the other region of the semiconductor substrate to form gettering regions. The gettering regions may be formed respectively below the source/drain regions.

A method of manufacturing an image sensor according to example embodiments of the inventive concepts may include forming a plurality of gate electrodes on a semiconductor substrate, the gate electrodes including at least a transfer gate electrode, a reset gate electrode, a drive gate electrode, and a selection gate electrode, forming a photodiode including n-type and p-type impurity ions in a first region of the semiconductor substrate on a first side of the transfer gate electrode, forming source/drain regions including n-type impurity ions in a second region of the semiconductor substrate, the source/drain regions formed on a second side of the transfer gate electrode, and sides of the reset, drive and selection gate electrodes and implanting carbon atoms into the second region of the semiconductor substrate to form at least one gettering region below at least one of the source/drain regions.

A method of manufacturing an image sensor according to example embodiments of the inventive concepts may include forming a gate on a semiconductor substrate, forming a first conductive region in the substrate adjacent to the gate, forming a second conductive region separated from the first conductive region in the substrate and forming a gettering region in the substrate adjacent to the second conductive region such that the second conductive region is between a surface of the substrate and at least part of the gettering region.

BRIEF DESCRIPTION OF THE DRAWINGS

Example embodiments of the inventive concepts will be more clearly understood from the following brief description taken in conjunction with the accompanying drawings. FIGS. 1-10 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concepts.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
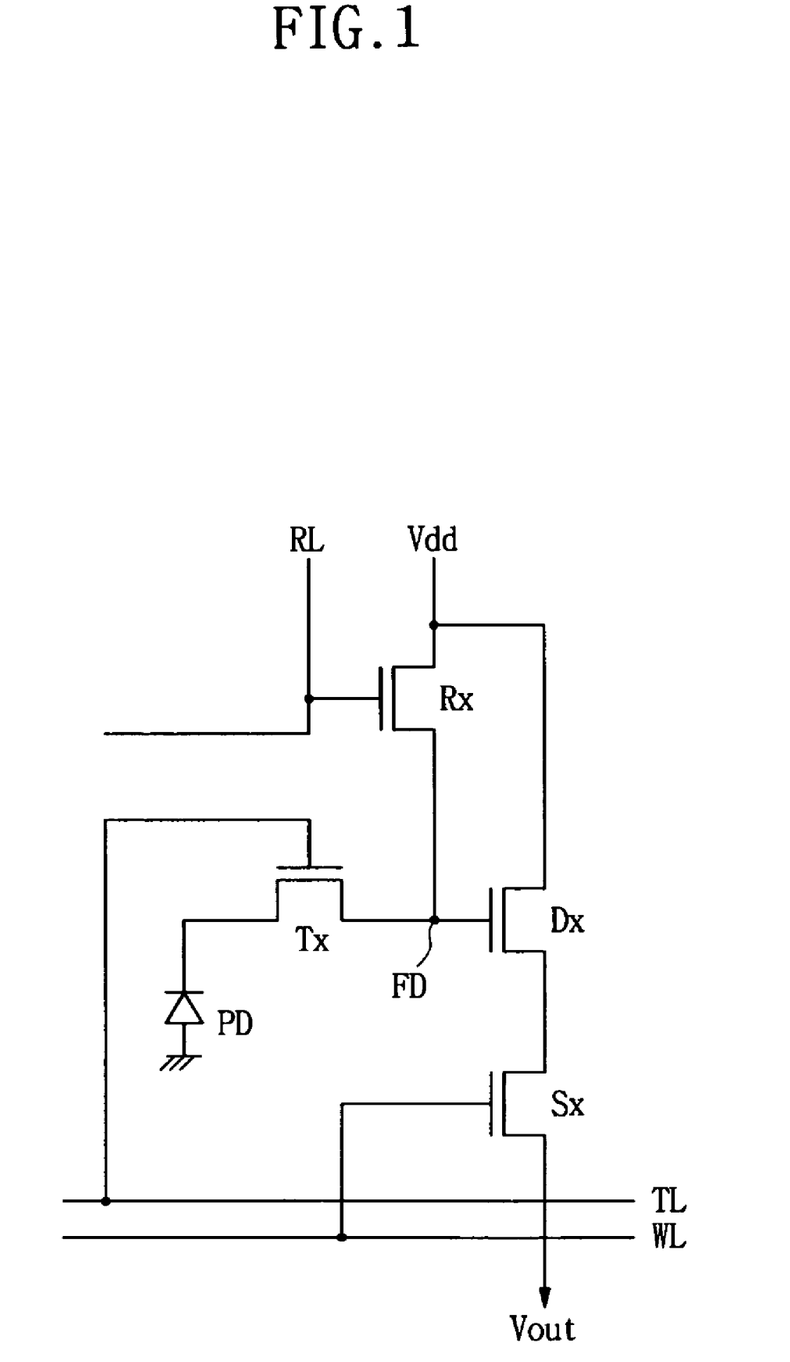
FIG. 1 is an equivalent circuit diagram of a unit pixel in a CMOS image sensor according to example embodiments of the inventive concepts.
Figure 2:
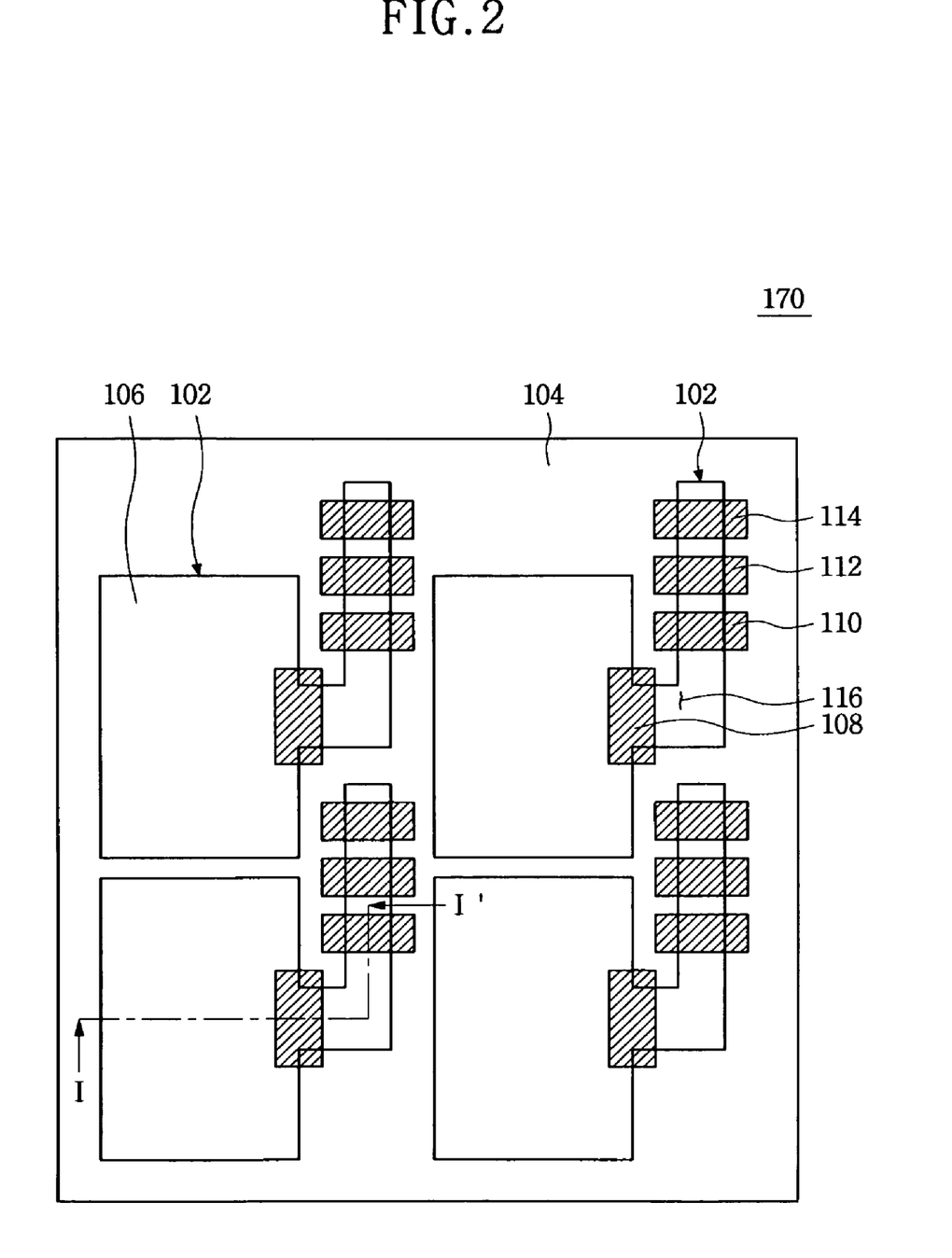
FIG. 2 is a plan view of multiple unit pixels of a CMOS image sensor according to example embodiments of the inventive concepts.

FIG. 1 is an equivalent circuit diagram of a unit pixel in a CMOS image sensor according to example embodiments of the inventive concepts. FIG. 2 is a plan view of multiple unit pixels of a CMOS image sensor according to example embodiments of the inventive concepts. Referring to FIGS. 1 and 2, a CMOS image sensor 170 according to example embodiments may include a plurality of unit pixels. Each of the unit pixels may have active regions 102 defined by an isolation layer 104. The active region 102 may be divided by first and second regions. The first region may have a photoelectric conversion region 106. The second region may have a reset region 110, a drive region 112 and a selection region 114. The first and second regions may have a transfer region 108 therebetween.

The photoelectric conversion region 106 may include a photoelectric conversion device (e.g., the photodiode (PD) of FIG. 1). The transfer region 108 may include a transfer transistor Tx, the reset region 110 may include a reset transistor Rx, the drive region 112 may include a drive transistor Dx and the selection region 114 may include a selection transistor Sx. The reset transistor Rx, the drive transistor Dx, and the selection transistor Sx may be arranged in correspondence to the reset region 110, the drive region 112 and the selection region 114 along the second region of the active region 102. However, one having ordinary skill in the art understands that the arrangement of the reset transistor Rx, the drive transistor Dx, and the selection transistor Sx may be modified together with the reset region 110, the drive region 112, and the selection region 114. Example embodiments according to FIGS. 1 and 2 are illustrative.

The photoelectric conversion region 106 may serve to convert incident light into an electric signal. A photodiode PD of the photoelectric conversion region 106 may generate and accumulate photoelectric charges corresponding to a quantity of the incident light. The photodiode PD may include, for example, an n-type impurity region and a p-type impurity region. The transfer region 108 may transfer the photoelectric charges accumulated in the photoelectric conversion region 106 to a detection region 116 through the transfer transistor Tx. The transfer transistor Tx may include, for example, an NMOS transistor and may be controlled by a charge transfer driving signal provided to a gate electrode thereof.

The detection region 116 may convert the photoelectric charges accumulated on the photodiode PD of the photoelectric conversion region 106 into a voltage signal. The detection region 116 may be disposed away from the photodiode PD. The detection region 116 may accumulatively store the photoelectric charges transferred through the transfer transistor Tx. The detection region 116 may be a floating diffusion region FD and may be, for example, an n-type impurity region. The floating diffusion region FD may be electrically connected to a gate electrode of the drive transistor Dx through a first node (not shown) and may control the drive region 112.

The transfer transistor Tx may have drivability sufficient to transfer collected photoelectric charges from the photodiode PD to the floating diffusion region FD. When the photoelectric charges are not completely transported to the floating diffusion FD region (e.g., photoelectric charges remain in the photodiode PD) the definition of the CMOS image sensor may be deteriorate due to an image lag phenomenon. A source region of the transfer transistor Tx may be connected to the photodiode PD of the photoelectric conversion region 106. The source region of the transfer transistor Tx may correspond to the n-type impurity region of the photodiode PD. A drain region of the transfer transistor Tx may correspond to the floating diffusion region FD of the detection region 116 which may include n-type impurity ions implanted at a high dose (e.g., at a high concentration).

The reset region 110 may serve to periodically reset the detection region 116 through the reset transistor Rx. The reset transistor Rx may include, for example, an NMOS transistor and may be driven by a reset signal provided to a gate thereof. A source region of the reset transistor Rx may be electrically connected to the floating diffusion region FD of the detection region 116. A drain region of the reset transistor Rx may be a region to which a power supply voltage Vdd is applied. The reset transistor Rx may be electrically connected to the power supply voltage Vdd and the drive transistor Dx of the drive region 112.

The drive transistor Dx of the drive region 112 may be connected to an external constant current source (not shown) and may be a source follower buffer amplifier. The drive transistor Dx may include, for example, an NMOS transistor and may drive a voltage signal of the detection region 116. The drive transistor Dx may share a drain region with the reset transistor Rx, in which the drain region may be a region to which the power supply voltage Vdd is applied. The drive transistor Dx may share a source region with the selection transistor Sx of the selection region 114.

The selection region 114 may select one unit pixel to be read from the plurality of unit pixels through selection of a transistor Sx. The selection transistor Sx may include, for example, an NMOS transistor and may be driven by a pixel selection signal applied to a gate electrode thereof. A drain region of the selection transistor Sx may be electrically connected to an output line Vout. A gate electrode of the transfer transistor Tx may be electrically connected to a transfer line TL. The gate electrode of the selection transistor Sx may be electrically connected to a word line WL. The gate electrode of the reset transistor Rx may be electrically connected to a reset line RL.

Source and drain regions are labeled as either a source or a drain for the sake of convenience. A source may be a drain and a drain may be a source according to an operation of a transistor. The source region and the drain region may be independently allotted to each transistor and, in that case, two of the transistors may not share a source and/or drain region.

A unit pixel may output data as follows. Referring to FIG. 1, the reset transistor Rx may be turned on by applying a voltage corresponding to logic "1" (high level) to the reset line RL. All photoelectric charges remaining in the floating diffusion region FD may be removed so that the unit pixel may be initialized. The reset transistor Rx may be turned off When incident light is irradiated onto the photodiode PD of the initialized unit pixel, electrons may be generated within the photodiode PD (e.g., within an n-type impurity region).

A voltage corresponding to logic "1" (high level) may be applied to the transfer line TL and the word line WL in order to generate an output signal corresponding to the incident light. The transfer transistor Tx and the selection transistor Sx may be turned on. Electrons within the photodiode PD (e.g., within an n-type impurity region) may be transferred into the floating diffusion region FD. Current drivability of the drive transistor Dx may be determined by a quantity of the electrons transferred into the FD region and an output voltage Vout may be induced at an output terminal of the selection transistor Sx. The output voltage Vout may be determined by the intensity of the incident light irradiated onto the photodiode PD.

Figure 3:
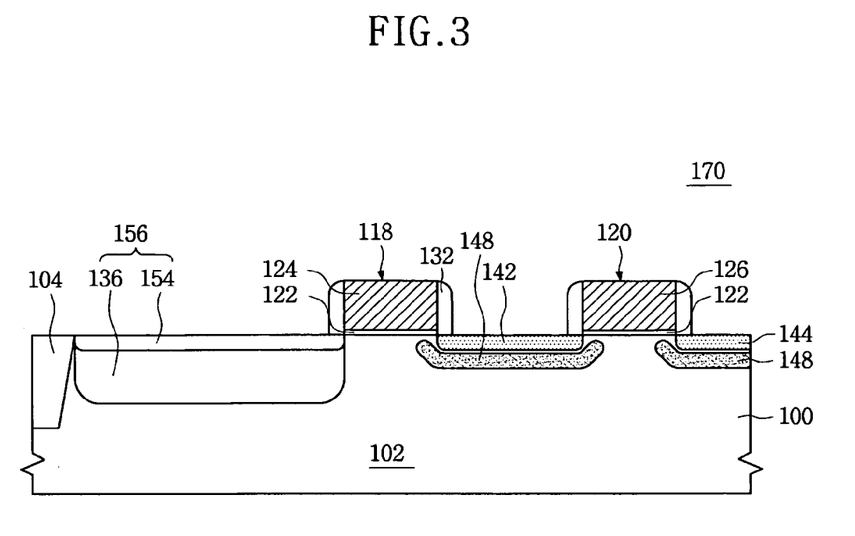
FIG. 3 is a cross-sectional view of a CMOS image sensor taken along line I-I' of FIG. 2 according to example embodiments of the inventive concepts.

FIG. 3 is a cross-sectional view of a CMOS image sensor taken along line I-I' of FIG. 2 according to example embodiments of the inventive concepts. Referring to FIG. 3, a CMOS image sensor 170 according to example embodiments may include a transfer transistor 118 and a reset transistor 120 (e.g., Tx and Rx of FIG. 1) in a unit pixel. For example, the transfer transistor 118 and the reset transistor 120 may be on the transfer region 108 and the reset region 110 of FIG. 2. The transfer transistor 118 and the reset transistor 120 may respectively have a transfer gate electrode 124 and a reset gate electrode 126 on an active region 102 defined by an isolation layer 104 in a semiconductor substrate 100.

Gate insulating layers 122 may be between the active region 102, the transfer gate electrode 124 and the reset gate electrode 126. The transfer gate electrode 124 and the reset gate electrode 126 may include, for example, n-type polysilicon. The transfer gate electrode 124 and the reset gate electrode 126 may include, for example, tungsten (W), titanium nitride (TiN), tantalum (Ta), tantalum nitride (TaN), and/or a combination thereof. The gate insulating layers 122 may include, for example, an oxide. Spacers 132 may be on sidewalls of the transfer gate electrode 124, the reset gate electrode 126 and the gate insulating layers 122.

The CMOS image sensor 170 may further include a drive transistor and a selection transistor of FIG. 1 in the unit pixel. For example, the drive transistor and the selection transistor may be respectively on the drive region 112 and the selection region 114 of FIG. 2. The drive transistor and the selection transistor may respectively have a drive gate electrode (not shown) and a selection gate electrode (not shown) on the active region 102. The drive gate electrode and the selection gate electrode may include, for example, n-type polysilicon. Gate insulating layers (not shown) may be disposed between the active region 102, the drive gate electrode and the selection gate electrode. Spacers (not shown) may be disposed on sidewalls of the drive gate electrode, the selection gate electrode, and the gate insulating layers.

A photodiode 156 may be in the active region 102 and may be overlapped with the transfer gate electrode 124. The photodiode 156 may have an n-type impurity region 136 and a p-type impurity region 154. The n-type impurity region 136 may occupy a wide region within the unit pixel region in order to receive a large quantity of light. The p-type impurity region 154 may be on the n-type impurity region 136 to, for example, a shallow depth. The p-type impurity region 154 may block electron inflow from the incident light to reduce dark current and/or dark noise.

Threshold voltage adjustment regions (not shown) may be disposed in the active region 102 below the transfer gate electrode 124 and the reset gate electrode 126. The threshold voltage adjustment regions may include, for example, n-type impurity ions of phosphorus (P) and/or arsenic (As). The threshold voltage adjustment regions may have the same impurity concentration or different impurity concentrations from each other.

A first source/drain region 142 may be in the active region 102 between the transfer gate electrode 124 and the reset gate electrode 126. The first source/drain region 142 may have a high-concentration of impurity ions. The first source/drain region 142 may include n-type impurity ions of, for example, phosphorus (P) or arsenic (As).

A second source/drain region 144 may be in the active region 102 and be overlapped with the reset gate electrode 126. The second source/drain region 144 may have a same or different impurity concentration as the first source/drain region 142. The second source/drain region 144 may include, for example, n-type impurity ions. Metal atoms may be in the semiconductor substrate 100 together with the first and second source/drain regions 142 and 144.

The metal atoms may contaminate the semiconductor substrate 100. A gettering region 148 may be in the active region 102 and be below the first and second source/drain regions 142 and 144. The gettering regions 148 may be adjacent to the first and second source/drain regions 142 and 144 and may surround lower and/or lateral regions of the first and second source/drain regions 142 and 144.

The gettering regions 148 may be located away from the first and second source/drain regions 142 and 144. The gettering regions 148 may not overlap the first and second source/drain regions 142 and 144. For example, the gettering regions 148 may be spaced apart from the first and second source/drain regions 142 and 144 by a distance of about 1 Å to about 3,000 Å. The gettering regions 148 may be located away from a top surface of the semiconductor substrate 100 and at a depth shallower than lower surfaces of the photodiode 156 and/or the isolation layer 104.

For example, the gettering regions 148 may be located away from the surface of the semiconductor substrate 100 and at a depth of about 500 Å to about 3,000 Å. The gettering regions 148 may overlap threshold voltage adjustment regions (not shown). The gettering regions 148 may include carbon (C) atoms. Metal atoms may be thermally diffused into the silicon substrate and transferred into the photodiode 156 during performance of a heat treatment process. The metal atoms may generate charges in the photodiode 156 even in a state where no light is incident on the photodiode 156.

The metal atoms may produce a result as if light is irradiated onto the photodiode 156 and may influence optical characteristics of the CMOS image sensor 170. The gettering regions 148 may capture metal atoms around and/or in the first and second source/drain regions 142 and 144. The metal atoms may be effectively captured by the gettering regions 148 including the carbon atoms and may cause stress in the active region 102. The gettering regions 148 may prevent and/or reduce migration of the metal atoms.

The migration of the metal atoms toward the photodiode 156 may be prevented and/or reduced so that the optical characteristics of the CMOS image sensor 170 may be improved. The gettering regions 148 may be around impurity diffusion regions except for the first and second source/drain regions 142 and 144. Although not shown, source/drain regions may be in the active region 102 around the drive and selection gate electrodes. The source/drain regions may have a same or different impurity concentration as the source/drain regions 142 and 144. The source/drain regions may be a same or different conductivity as the source/drain regions 142 and 144.

Gettering regions (not shown) may be in the semiconductor substrate and be respectively below the source/drain regions. The gettering regions may be adjacent to the source/drain regions and may surround the lower and/or lateral regions of the source/drain regions. The gettering regions may have a same or different impurity concentration as the gettering region 148. The gettering regions may be a same or different conductivity as the gettering regions 148. The gettering regions may be around impurity diffusion regions except for the source/drain regions.

Figure 4:
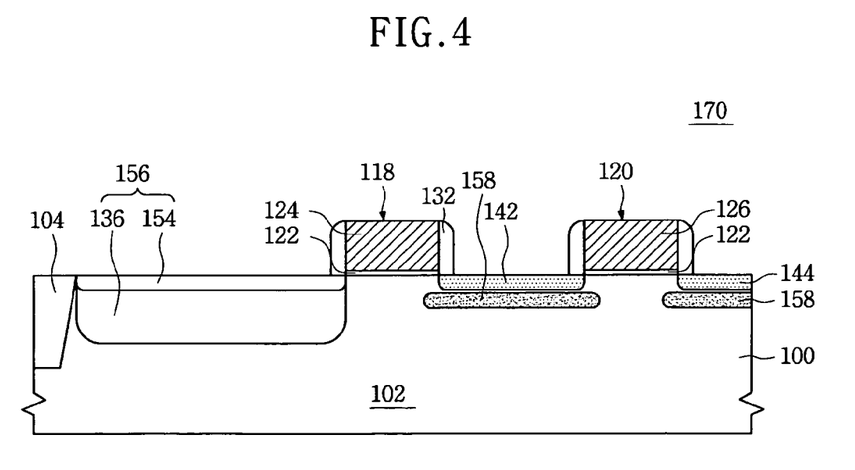
FIG. 4 is a cross-sectional view of a CMOS image sensor taken along line I-I' of FIG. 2 according to example embodiments of the inventive concepts.

FIG. 4 is a cross-sectional view of a CMOS image sensor taken along line I-I' of FIG. 2 according to example embodiments of the inventive concepts. A CMOS image sensor of FIG. 4 includes substantially the same components as that of FIG. 3. Thus, the same components will not be repetitively described, and will be referred to with the same names and reference numbers.

Referring to FIG. 4, a CMOS image sensor 170 according to example embodiments may include a photodiode 156, a transfer transistor 118, a reset transistor 120, first and second source/drain regions 142 and 144, and gettering regions 158. The first and second source/drain regions 142 and 144 may be, for example, an n-type conductivity in a semiconductor substrate 100. The gettering regions 158 may be in the semiconductor substrate 100.

The gettering regions 158 may be located below the first and second source/drain regions 142 and 144. The gettering regions 158 may have a wider surface area (e.g., may be wider) than that of the first and second source/drain regions 142 and 144. Migration of metal atoms toward the photodiode 156 may be prevented and/or reduced by the gettering regions 158, and optical characteristics of the CMOS image sensor 170 may be improved.

Figure 5:
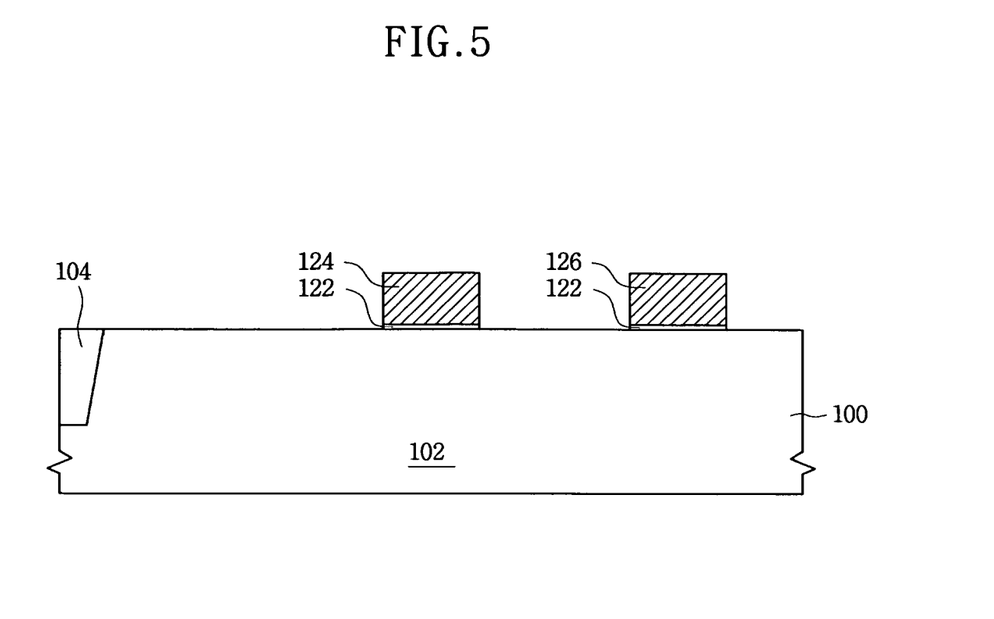
FIGS. 5-9 are cross-sectional views taken along line I-I' of FIG. 2 illustrating methods of manufacturing CMOS image sensors according to example embodiments of the inventive concepts.

FIGS. 5-9 are cross-sectional views taken along line I-I' of FIG. 2 illustrating methods of manufacturing CMOS image sensors according to example embodiments of the inventive concepts. FIGS. 5-9 may use the same names and reference numbers as FIG. 3. Referring to FIG. 5, an isolation layer 104 may be formed in a semiconductor substrate 100. The isolation layer 104 may be formed through performance of, for example, a shallow trench isolation (STI) process. The STI process is well known, and so the description thereof will be omitted. The isolation layer 104 may define a plurality of active regions 102 in the semiconductor substrate 100.

The semiconductor substrate 100 may include a first conductive well (not shown), for example, a p-well. The p-well may be formed by performing an ion implantation process on the semiconductor substrate 100 (e.g., an n-type semiconductor substrate) with, for example, p-type impurity ions. The p-well may have a p-type epitaxial layer therein. The p-type epitaxial layer may be formed in a lower and/or an upper region of the p-well.

An insulating layer (not shown) and a conductive layer (not shown) may be sequentially formed on the active region 102. The insulating layer may include, for example, an oxide and/or a nitride. The conductive layer may include, for example, n-type polysilicon, tungsten (W), titanium nitride (TiN), tantalum (Ta), tantalum nitride (TaN) and/or a combination thereof. The insulating layer may be patterned to form gate insulating layers 122. The conductive layer may be patterned to form a transfer gate electrode 124 and a reset gate electrode 126. Although not shown, during the formation of the transfer and the reset gate electrodes, both a drive gate electrode and a selection gate electrode may be formed together on the active region 102.

Before the formation of the transfer gate electrode 124 and the reset gate electrode 126, threshold voltage adjustment regions (not shown) may be formed in the active region 102. The threshold voltage adjustment regions may be formed to adjust threshold voltages of the transfer gate electrode 124 and the reset gate electrode 126. One selected threshold voltage adjustment region below the transfer gate electrode 124 may adjust threshold voltage of the transfer gate electrode 124 to about zero voltage. Photoelectric charges generated from a photodiode 156 of FIG. 3 may be transferred through a transfer transistor with no and/or reduced loss.

The threshold voltage adjustment regions may be formed by the following method. A mask pattern (not shown) may be formed on the semiconductor substrate 100 to partially expose the active region 102. N-type impurity ions may be implanted into the active region 102 to form the threshold voltage adjustment regions. The n-type impurity ions may include, for example, phosphorus (P) and/or arsenic (As). The threshold voltage adjustment regions may be formed using the ion implantation process at one time with respect to the transfer and reset gate electrodes 124 and 126, and/or one by one for the respective transfer and reset gate electrodes 124 and 126. After the formation of the threshold voltage adjustment regions, the mask pattern may be removed from the semiconductor substrate 100.

Before the formation of the transfer and reset gate electrodes 124 and 126, p-type impurity ions may be implanted under the isolation layer 104 to form a channel stop region (not shown).

Figure 6:
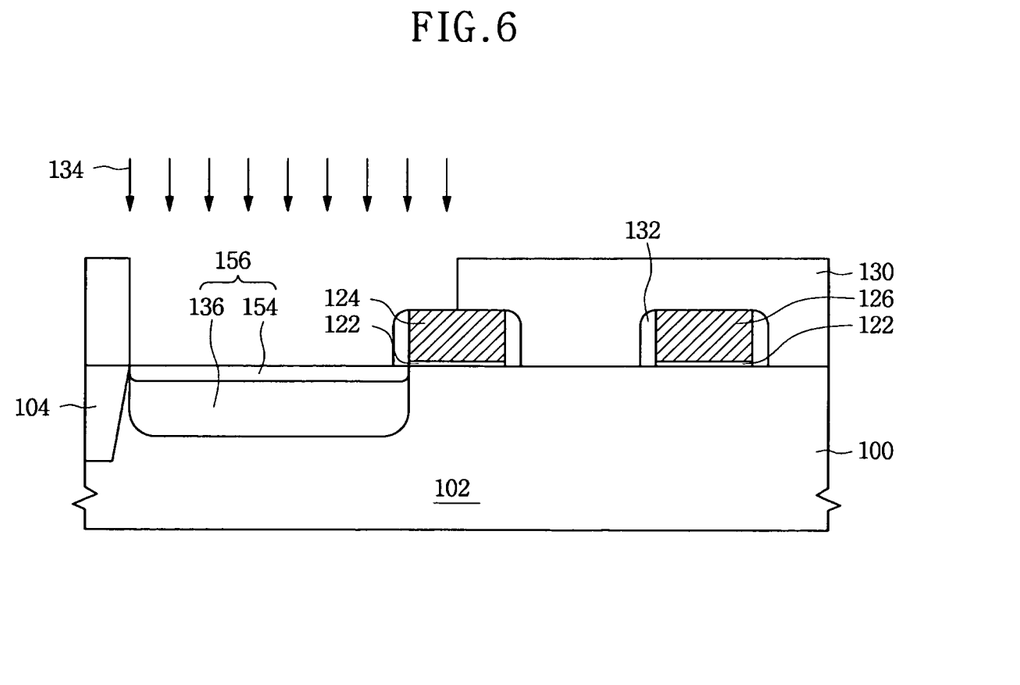

Referring to FIG. 6, spacers 132 may be formed on sidewalls of the transfer gate electrode 124 and the reset gate electrode 126. The spacers 132 may be formed on sidewalls of the drive and selection gate electrodes. The spacers 132 may include, for example, nitride. A first mask pattern 130 may be formed on the semiconductor substrate 100 to expose the isolation layer 104 and the transfer gate electrode 124. An ion implantation process 134 may be performed using the transfer gate electrode 124, spacers 132 and the first mask pattern 130 as a mask on the exposed active region 102 to form a preliminary n-type impurity region.

The ion implantation process 134 may be performed using, for example, n-type impurity ions with high energy and low dose. The preliminary n-type impurity region may be formed to have a wide area and a large depth in the active region 102. The ion implantation process 134 may be continuously performed using p-type impurity ions on the preliminary n-type impurity region to form a preliminary p-type impurity region. The semiconductor substrate 100 may be heat-treated to form the photodiode 156 including the n-type impurity region 136 and the p-type impurity region 154.

The p-type impurity region 154 may be formed in order to block electron inflow from the incident light to reduce dark current and/or dark noise, and may prevent and/or reduce photoelectric charge loss resulting from damage to the semiconductor substrate 100.

Figure 7:
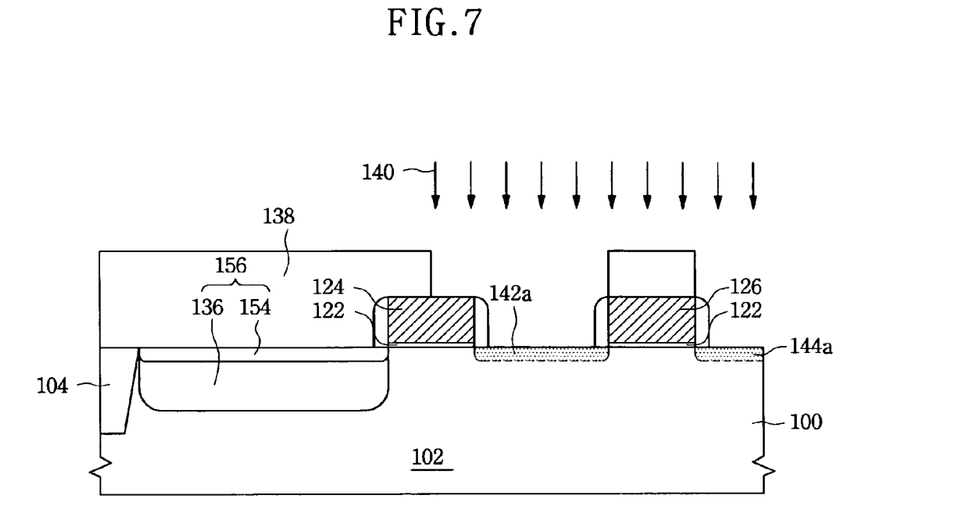

Referring to FIG. 7, after the formation of the photodiode 156, the first mask pattern 130 of FIG. 6 may be removed from the semiconductor substrate 100. A second mask pattern 138 may be formed to cover the photodiode 156 and expose the active region 102 around the transfer gate electrode 124 and the reset gate electrode 126. Although not shown, the active region 102 between the drive and selection gate electrodes may be exposed together with the transfer gate electrode 124 and the reset gate electrode 126 by the second mask pattern 138.

An ion implantation process 140 may be performed using the transfer and reset gate electrodes 124 and 126, and the second mask pattern 138, as a mask on the exposed active region 102 to form first and second preliminary source/drain regions 142a and 144a. The ion implantation process 140 may be performed using first impurity ions at high dose. The first impurity ions may have n-type conductivity. The first preliminary source/drain region 142a may be overlapped with the spacers 132 of the transfer and reset gate electrodes 124 and 126. The second preliminary source/drain region 144a may be overlapped with the spacer 132 of the reset gate electrode 126.

Although not shown, preliminary source/drain regions may be formed in the active region 102 around the drive and selection gate electrodes by the performance of the ion implantation process 140. The preliminary source/drain regions, and the first and second preliminary source/drain regions 142a and 144a may be formed through performance of the same one or more ion implantation processes. The preliminary source/drain regions, and the first and second preliminary source/drain regions 142a and 144a may be formed through performance of different ion implantation processes from each other.

Figure 8:
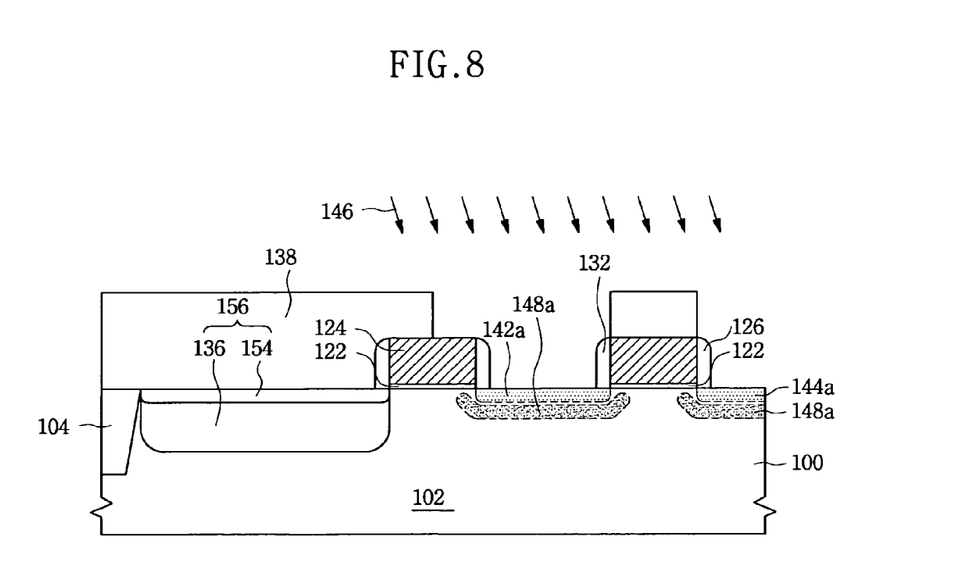

Referring to FIG. 8, an ion implantation process 146 may be performed using the transfer gate electrode 124 and the reset gate electrode 126, and the second mask pattern 138, as a mask on the exposed active region 102 of FIG. 7 to form preliminary gettering regions 148a. The ion implantation process 146 may be performed using second impurity ions on the active region 102. The ion implantation process 146 may include a slant ion implantation process to make the impurity ions move in one direction while rotating the semiconductor substrate 100 to implant the second impurity ions into the semiconductor substrate 100. The preliminary gettering regions 148a may be formed to surround lower and lateral regions of the preliminary source/drain regions, and first and second preliminary source/drain region 142a and 144a.

The preliminary gettering regions 148a may be formed adjacent to the preliminary source/drain regions, and the first and second preliminary source/drain regions 142a and 144a. The second impurity ions may include, for example, carbon (C). The ion implantation process 146 may be performed at a dose of, for example, about 1.0E14 atoms/cm$^2$ to about 5.0E15 atoms/cm$^2$, and with an energy of about 10 keV to about 100 keV.

Figure 9:
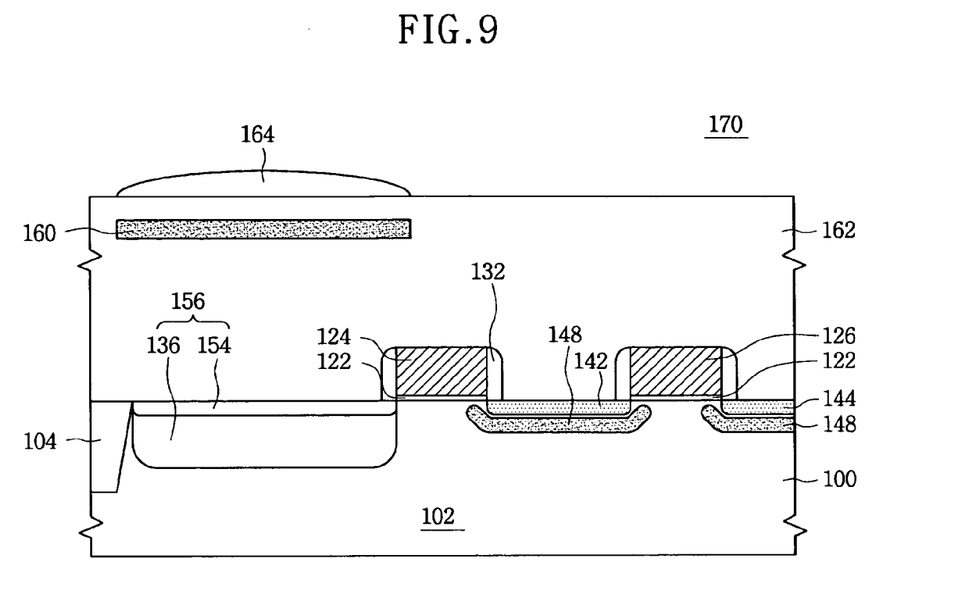

Referring to FIG. 9, the second mask pattern 138 may be removed from the semiconductor substrate 100. A heat treatment may be performed on the semiconductor substrate 100 having the preliminary source/drain regions, the first and second preliminary source/drain regions 142a and 144a, and the preliminary gettering regions 148a. The heat treatment may include a rapid thermal annealing (RTA) technique. The preliminary source/drain regions, the first and second preliminary source/drain regions 142a and 144a, and the preliminary gettering regions 148a may include the first and second impurity ions.

The first and second impurity ions may be diffused toward the active region from preliminary source/drain regions, the first and second preliminary source/drain regions 142a and 144a, and the preliminary gettering regions 148a through the performance of the heat treatment. The preliminary source/drain regions, the first and second preliminary source/drain regions 142a and 144a, and the preliminary gettering regions 148a may be respectively formed as source/drain regions, first and second source/drain regions 142 and 144, and gettering regions 148.

The gettering regions 148 may be formed adjacent to the source/drain regions, and the first and second source/drain regions 142 and 144. For example, the gettering regions 148 may be formed to be spaced apart from the source/drain regions, and the first and second source/drain regions 142 and 144. For example, the gettering regions 148 may be formed to be spaced apart from the source/drain regions, and the first and second source/drain regions 142 and 144 by a distance from about 1 Å to about 3,000 Å.

The gettering regions 148 may be formed from an upper surface of the semiconductor substrate 100 at a depth shallower than lower surfaces of the photodiode 156 and isolation layer 104. For example, the gettering regions 148 may be formed from the surface of the semiconductor substrate 100 to a depth of about 500 Å to about 3,000 Å. The photodiode 156 of FIG. 6 may alternatively be formed after the formation of the gate electrodes, the source/drain regions, and the gettering regions. The gettering regions 148 may capture metal atoms implanted along with the first impurity ions during the formation of the source/drain regions, and the first and second source/drain regions 142 and 144.

The metal atoms may be generated through various parts such as a mass selector, a focus/accelerator, and/or a plasma flood gun of the ion implantation equipment. This is because these parts may be made of a metal material such as an aluminum (Al) alloy. The metal atoms may be transferred into the photodiode 156 and may generate photoelectric charges in the photodiode 156 even in a state where no light is incident onto the photodiode 156. The metal atoms may produce a result as if light is irradiated onto the photodiode 156. In order to prevent and/or reduce this phenomenon, the gettering regions 148 may capture the metal atoms using the carbon atoms. The metal atoms may be prevented from being transferred into the photodiode 156 or transfer may be reduced.

Metal interconnections (not shown), color filters 160, interlayer dielectrics (ILDs) 162, light shielding layers (not shown), and micro lens 164 may be formed on the semiconductor substrate 100 including the photodiode 156 and gettering regions 148, so that the CMOS image sensor 170 may be formed. The light shielding layers (not shown) may be formed on the semiconductor substrate 100 to expose the photodiodes 156 such that light is incident only on the photodiodes 156. The color filters 160 may be formed on the photodiodes 156. The micro lens 164 may be formed on the color filters 160. The ILDs 162 may be formed between the semiconductor substrate 100 and the micro lens 164.

Figure 10:
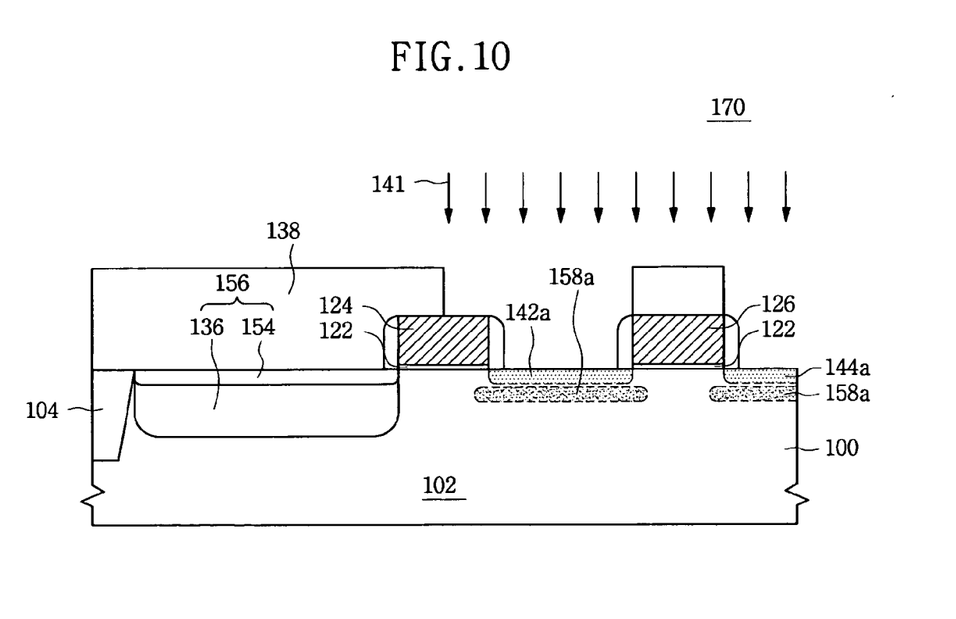
FIG. 10 is a cross-sectional view taken along line I-I' of FIG. 2 illustrating methods of manufacturing CMOS image sensors according to example embodiments of the inventive concepts.

FIG. 10 is a cross-sectional view taken along line I-I' of FIG. 2 illustrating methods of manufacturing CMOS image sensors according to example embodiments of the inventive concepts. Referring to FIG. 10, for forming a CMOS image sensor 170 according to example embodiments of the inventive concepts, the preliminary source/drain regions, and the first and second preliminary source/drain regions 142a and 144a of FIG. 7 may be first formed in and on the active region 102. An ion implantation process 141 may be performed using the second mask pattern 138 of FIG. 8, the transfer and reset gate electrodes 124 and 126, and the drive and selection gate electrodes as a mask, on the active region 102 around the transfer and reset gate electrodes 124 and 126, and the drive and selection gate electrodes, to form preliminary gettering region 158a.

The preliminary gettering region 158a may be formed using, for example, the second impurity ions of FIG. 8. The second impurity ions may be implanted into the semiconductor substrate 100 along a direction perpendicular to the semiconductor substrate 100. After removal of the second mask pattern 138 from the semiconductor substrate 100, the preliminary gettering region 158a may be heat-treated to form gettering regions (not shown). The gettering regions may have the same function as the gettering regions 148 of FIG. 9.

Although example embodiments are described with respect to a CMOS image sensor, example embodiments are not so limited. For example, the gettering regions may be applied to an image sensor using a charge coupled device (CCD). The gettering regions may be formed around source/drain regions of a CCD image sensor, thereby gettering metal atoms in a semiconductor substrate.

According to example embodiments, CMOS image sensors may be provided including gettering regions. The gettering regions may be, for example, below source/drain regions of a transistor in an active region. The gettering region may include, for example, carbon atoms. The gettering region may capture metal atoms implanted into the active region from, for example, various parts of ion implantation equipment. The metal atoms may be prevented from being transferred into the photodiode, or the transfer may be reduced, so that the optical characteristics of the CMOS image sensor may be improved.

While example embodiments have been particularly shown and described, it will be understood by one of ordinary skill in the art that variations in form and detail may be made therein without departing from the spirit and scope of the claims.

What is claimed is:

1. A method of manufacturing an image sensor, comprising:
  forming a gate electrode on a semiconductor substrate;
  forming a source/drain region in the semiconductor substrate adjacent to the gate electrode;
  forming a photodiode in the semiconductor substrate adjacent to the gate electrode; and
  forming a gettering region in the semiconductor substrate at a distance of about 1 Å to about 3,000 Å from the source/drain region such that the gettering region surrounds lower and lateral regions of the source/drain region,
  wherein the forming of the gettering region includes implanting carbon atoms into the semiconductor substrate along a direction at least one of perpendicular and inclined to the semiconductor substrate using an ion implantation process, and
  wherein the forming of the gettering region includes forming a lower surface of the gettering region closer to an upper surface of the semiconductor substrate than a lower surface of the photodiode.

2. The method of claim 1, wherein the forming of the gettering region includes forming the gettering region about 500 Å to about 3,000 Å from a surface of the semiconductor substrate.

3. The method of claim 1, wherein the forming of the source/drain region and the forming of the gettering region include implanting a first type of impurity used to form the source/drain region and a second type of impurity used to form the gettering region through a same mask pattern, the first type of impurity being different from the second type of impurity.

4. The method of claim 1 wherein the implanting of the carbon atoms includes implanting the carbon atoms into the semiconductor substrate at a dose of about 1.0E14 atoms/cm$^2$ to about 5.0E15 atoms/cm$^2$, and with an energy of about 10 keV to about 100 keV.

5. A method of manufacturing an image sensor, comprising:
  forming a gate on a semiconductor substrate;
  forming a photoelectric conversion region in the semiconductor substrate adjacent to the gate;
  forming a source/drain region separated from the photoelectric conversion region in the semiconductor substrate;
  forming a gettering region including carbon doped silicon in the semiconductor substrate adjacent to the source/drain region such that the source/drain region is between a surface of the semiconductor substrate and at least part of the gettering region and the gettering region surrounds lower and lateral regions of the source/drain region; and
  heating the photoelectric conversion region, the source/drain region and the gettering region simultaneously,
  wherein the forming of the gettering region includes forming the gettering region closer to the surface of the semiconductor substrate than a surface of the photoelectric conversion region that is farthest away from the surface of the semiconductor substrate.

6. The method of claim 5, wherein the forming of the gettering region includes implanting carbon atoms using a slant implantation process while rotating the semiconductor substrate such that the source/drain region is surrounded by the gettering region in the semiconductor substrate.

7. The method of claim 5, wherein the forming of the gettering region includes implanting carbon atoms perpendicularly to the surface of the semiconductor substrate such that the gettering region is formed substantially parallel to the source/drain region.

8. The method of claim 5, further comprising:
  forming a third conductive region in the semiconductor substrate adjacent to the gate and separated from the photoelectric conversion and source/drain regions.

9. The method of claim 8, wherein the forming of the gettering region does not include forming the gettering region adjacent to the third conductive region.

10. The method of claim 5, wherein the forming of the gettering region includes forming the gettering region a distance of about 1 Å to about 3,000 Å from the second conductive region.

* * * * *